Figure 1:
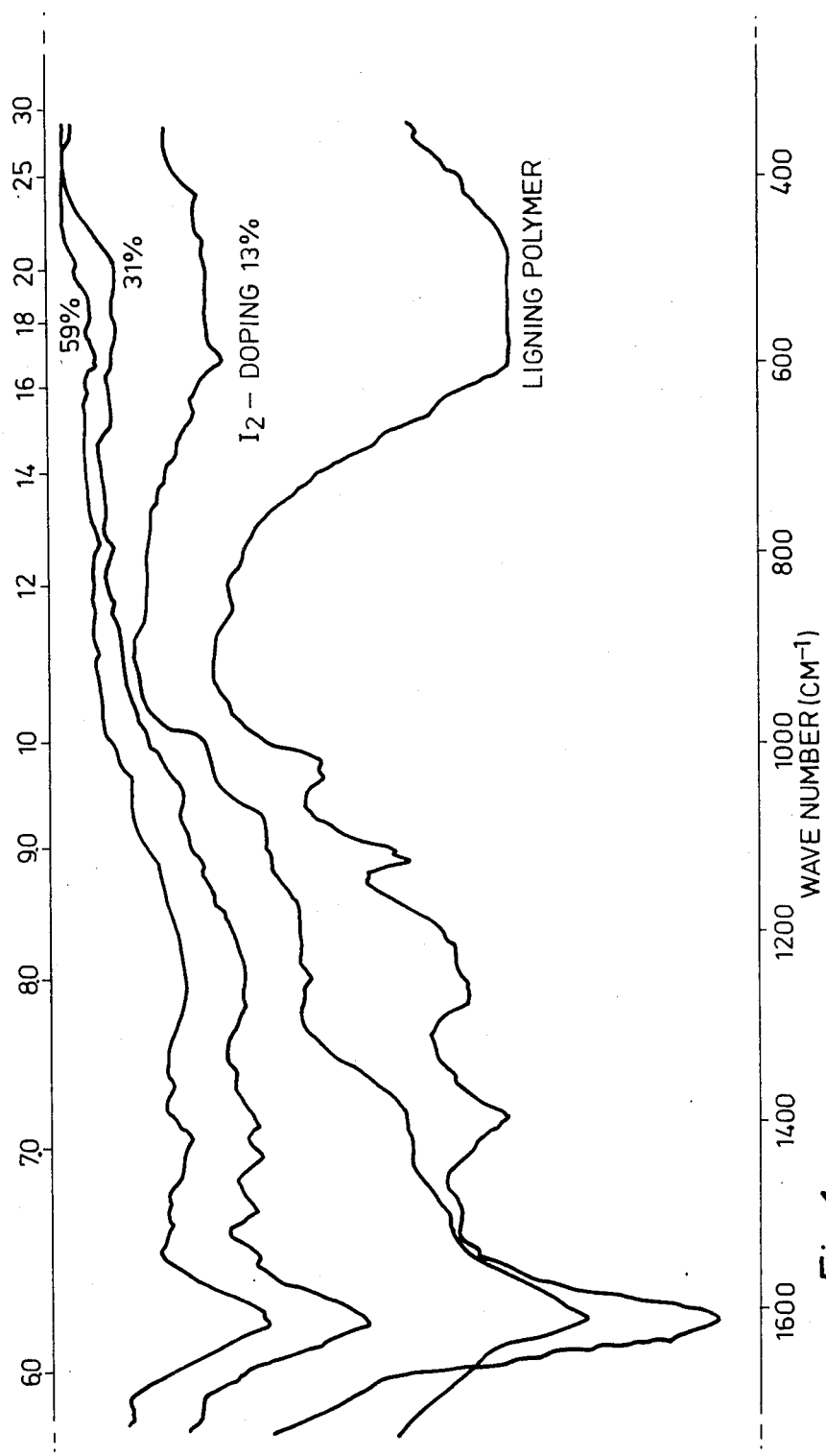

United States Patent [19]

Kaila et al.

[11] Patent Number: 4,610,809

[45] Date of Patent: Sep. 9, 1986

[54] DOPED LIGNIN POLYMER

[75] Inventors: Ermo Kaila, Mänttä ; Anita Kinanen, Kouvola; Kalle Levon, Helsinki; Johannes Turunen, Rauma; Jan-Erik Österholm, Porvoo; J. Johan Lindberg, Vantaa, all of Finland

[73] Assignee: Rauma-Repola Oy, Rauma, Finland

[21] Appl. No.: 694,796

[22] Filed: Jan. 25, 1985

[30] Foreign Application Priority Data

Jan. 26, 1984 [FI] Finland ................................ 840312

[51] Int. Cl.4 .............................................. H01B 1/00
[52] U.S. Cl. ...................................... 252/500; 252/512; 252/518; 524/80; 524/401; 524/408; 524/422; 524/435; 524/439

[58] Field of Search .................. 252/500, 512, 518; 524/80, 401, 408, 422, 435, 13, 72, 73, 439, 735

[56] References Cited

U.S. PATENT DOCUMENTS 4,107,111  8/1978  Lindberg et al. ...................... 524/73
4,222,903  9/1980  Heeger et al. ........................ 252/518

Primary Examiner—Josephine L. Barr
Attorney, Agent, or Firm—Burns, Doane, Swecker & Mathis

[57] ABSTRACT

A polymer that has been made of lignen and that contains sulphur, and into which a compound that activates the conductivity, such as iodine or ferric chloride, has been doped. The doped lignin polymer has properties of a semiconductor.

18 Claims, 2 Drawing Figures

DOPED LIGNIN POLYMER

The invention is concerned with a doped lignin polymer that can be used as a semiconductor.

When pure, plastics are insulators. Certain plastics can be blended or doped with certain compounds so as to produce electric conductivity. Conductivity, and so also semiconductivity, is based on a charge-carrying capacity, whose mechanism is, for the time being, not known exactly.

So far, mostly compounds have been used that contain conjugated double bonds, which permit movement of charge carriers along the polymer chain. The quantity of the doping agent in a semiconductor is usually large, even dozens of percentage units from the weight of the plastic. As a rule, the conductivity is increased with an increase in the quantity of doping agent.

The conductivity of insulators is lower than $10^{-6}$ $Scm^{-1}$. The conductivity of substances included in semiconductors is within the range of $10^{-6}$ to $10^2$ $Scm^{-1}$. The conductivity of undoped silicon is of the order of $10^{-4}$ $Scm^{-1}$, and that of germanium about $10^{-2}$ $Scm^{-1}$. It has been possible to increase the conductivity of polybenzothiophene doped with arsenic pentafluoride even to $10^3$ $Scm^{-1}$, i.e. to the level of metals of lowest electric conductivity. A conductivity as good as this is not necessarily required from semiconductors, but the properties depend on the purpose of use.

The best-known semiconductors so far are the silicon chips. Since their manufacture is difficult and expensive, attempts have been made to develop semiconductors made of plastics in their place. These are of lower cost, and their machining is, in principle, similar to the machining of plastics.

In prior art, the electric conductivity of polymers has been improved by doping them, e.g., with iodine, ferric chloride, or arsenic pentafluoride, whereby the properties of conductivity are improved. As an example may be mentioned doping of polyacetylene, in which the best conductivity has been obtained with arsenic pentafluoride. Similar semiconductors have been prepared both from sulphur-free and from sulphur-containing polymers, from polyphenylene sulphide, polypyrrole, polyparaphenylene, polybenzothiophene, etc.

Many of the polymers used as the basic plastics of semiconductors (such as, e.g., polyacetylene) are so sensitive to the effect of the oxygen in the air that they cannot be stored or machined in any other way except in an inert gas. A compound used as a doping agent usually makes them even more sensitive to oxygen. Thorough protective measures increase the cost of the products. Some doping agents, such as, e.g., arsenic pentafluoride, are highly toxic and cause work-hygenic and environmental problems, e.g. in the event of a fire.

The objective of the present invention is to provide polymers doped as semiconductors which are of lower cost and easier to process as compared with corresponding polymers known in prior art. In order to find such polymers, lignosulphonates and other lignin preparations in which the oxygen-ether bridges between the units are retained were doped with various compounds used for this purpose. The results were, however, poor in respect of the conductivity.

It was, however, noticed surprisingly that, on doping, the sulphur-containing lignin polymer in accordance with the Finnish Pat. No. 50,993 (corresponds to the U.S. Pat. No. 4,107,111) formed rather good, stable semiconductors. This matter was also surprising therefore that, as far as we know, the lignin polymer does not have a regular structure, as do the earlier synthetic polymers used for this purpose. Even native lignin in plants consists of different structural units, which can be identified, e.g., after sulphite cooking. When lignin is treated with elementary sulphur at a temperature of 200° to 300° C., further changes take place. Moreover, the sulphur contents in the lignin polymer used in the invention vary within the range of 5 to 55%, whereas the ratio of sulphur to carbon in the synthetic sulphur-containing polymers is invariable.

The doped lignin polymer in accordance with the present invention is characterized in that the undoped polymer contains a maximum of 55 percent by weight of sulphur and that into it a compound activating the conductivity has been doped as a quantity of 0.1 to 60 percent of the weight of the undoped polymer.

The conductivity of the undoped lignin polymer is about $10^{-10}$ $Scm^{-1}$, and after doping about $10^{-3}$ $Scm^{-1}$, so that the conductivity has become $10^6$-fold. For the first time, a semiconductor has been prepared out of a renewable natural material, modified lignin. Lignin is available without limitation, because it is one of the most important structural components of plants, in particular of treelike plants. Its recovery from the spent liquors of the cooking of pulp has been resolved technically, and the preparation of lignin polymer is relatively simple. On a large scale, the preparation of lignin polymer becomes less expensive than the preparation of the synthetic polymers currently used in the semiconductor industry. It has been noticed that lignin polymer is preserved at $+5°$ C. even for 5 years without being protected from the oxygen contained in the air. Lignin polymer is not toxic either. A semiconductor can be prepared from it rather simply, and a finished semiconductor is remarkably stable and does not require such protective measures as are required by most of the other semiconductors described in the literature. The lignin polymer is partly soluble in certain solvents, which may facilitate the doping.

The lignin polymer used in the invention is prepared in accordance with the Finnish Pat. No. 50,993 out of elementary sulphur and of some lignin, e.g. lignin pretreated with an alkali. The lignin must be pure, and it can be isolated from the cooking liquor by technical methods known in prior art, such as ultrafiltration, amine extraction, or ion exclusion. The lignin molecules consist of several different basic units, whose skeleton is made of p-hydroxy-phenlyguaiacyl and syringyl groups. In a reaction with sulphur, e.g., the sulphonic-acid groups are cleaved off, the ether bonds are released, and carbon-carbon bonds and bonds of sulphur both with aromatic and with aliphatic carbons are formed between the units.

By adding to the polymer a doping agent that activates the conductivity, a compound is formed whose structure is not known but which operates as a semiconductor.

As doping agents, it is possible to use both p-type and n-type compounds that activate the conductivity. Of such compounds should be mentioned $Br_2$, $Cl_2$, IBr, ICl, $MoCl_5$, $SnCl_4$, $H_2SO_4$, Li, Na, K, as well as, in particular, $I_2$, $FeCl_3$, and $AsF_5$.

The quantity of doping agent above all depends on the desired conductivity. By performing the doping in a completely inert atmosphere, it is possible to improve the conductivity further.

Before the doping, it is possible to add, to the lignin polymer, some plastic, softener, or some other admixture in order to improve the technical properties.

The invention will be described in more detail by means of the following examples and the IR-spectra related to them, the objective of the said examples and spectra being not to restrict the invention or its possibilities of use.

EXAMPLE 1

To a sulphur-containing polymer made of lignin (sulphur content 11 to 13 percent by weight), iodine was added by vaporization in an exsiccator. The doping degrees of the samples (quantity of added agent as a percentage of the weight of undoped polymer) were determined. Tablets were compressed out of the samples (compression pressure 10,000 kg/cm$^2$), and their conductivity was measured. The conductivity of the undoped lignin polymer was measured in a corresponding way. The conductivities obtained are given in Table 1. The IR-spectra of the samples are given in FIG. 1.

TABLE 1

| Sample | Doping degree % | Conductivity Scm$^{-1}$ |
| --- | --- | --- |
| Undoped lignin polymer | — | $1.2 \cdot 10^{-10}$ |
| 1 | 13 | $3.0 \cdot 10^{-6}$ |
| 2 | 31 | $1.1 \cdot 10^{-5}$ |
| 3 | 42 | $5.0 \cdot 10^{-5}$ |
| 4 | 59 | $2.8 \cdot 10^{-4}$ |

EXAMPLE 2

Figure 2:
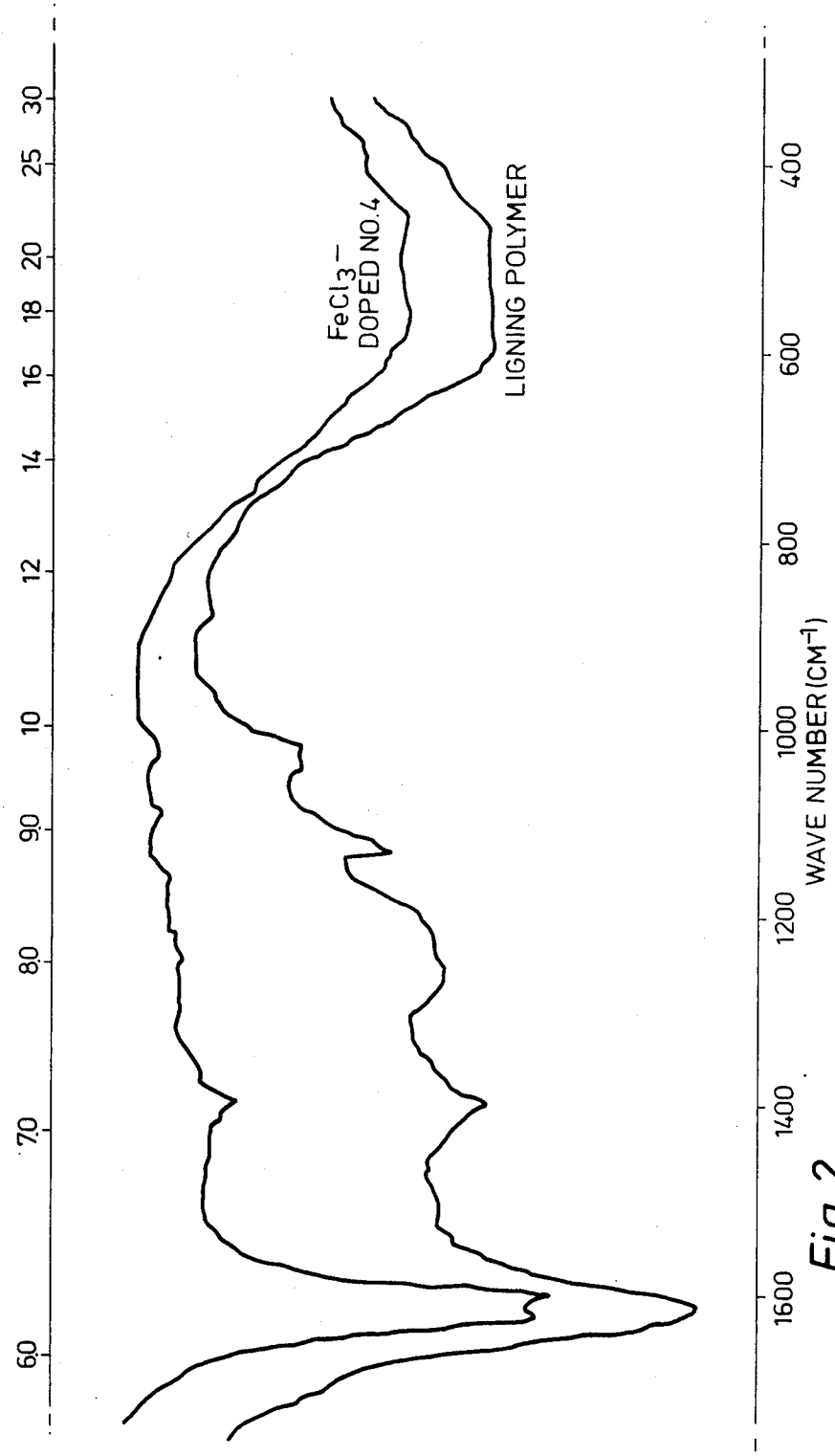

A saturated solution was prepared of dried ferric chloride in anhydrous nitromethane (dried by means of a molecular sieve). A sulphur-containing polymer made of lignin (sulphur content 11 to 13 percent by weight) was placed into the saturated solution. Four doped samples were prepared as follows: 20 ml of FeCl$_3$/nitromethane solution and 1 to 3 g of lignin polymer were mixed in nitrogen for 3 h, whereupon the mixture was filtered and washed with nitromethane. The mixture was dried in an exsiccator. Tablets were compressed out of the samples, and their conductivity was determined. Moreover, KBr tablets were prepared, whose IR-spectra were determined. Part of the lignin polymer is dissolved in the solution, so that the doping degree cannot be observed by means of the difference in weight. By lowering the proportion of the lignin polymer in the solution, it is, however, possible to make the doping degree higher. The doping degrees was observed by means of ESR-spectroscopy, for the doping degree comes out in the ratio of intensities of the spectral lines. Table 2 gives the conductivities of the lignin polymers doped with ferrichloride, the quantities of lignin polymer used for doping, as well as the ratio of intensities of the ESR-spectra of the products. FIG. 2 shows the corresponding IR-spectra.

TABLE 2

| Sample | Weight before doping g | ESR intensity ratio | Conductivity Scm$^{-1}$ |
| --- | --- | --- | --- |
| Undoped lignin polymer | — | 0.91 | $1.2 \cdot 10^{-10}$ |
| 1 | 3.0 | 0.99 | $7.7 \cdot 10^{-6}$ |
| 2 | 2.5 | 0.96 | $3.1 \cdot 10^{-6}$ |
| 3 | 2.0 | 1.12 | $1.6 \cdot 10^{-6}$ |
| 4 | 1.0 | 1.12 | $6.0 \cdot 10^{-3}$ |

What is claimed is:

1. Doped lignin polymer comprising an undoped polymer containing a maximum of 55 percent by weight of sulphur and a compound activating the conductivity of said polymer in a quantity of 0.1 to 60 percent of the weight of the undoped polymer.

2. Lignin polymer as claimed in claim 1 wherein the compound that activates the conductivity is iodine, bromine, chlorine, iodine bromide, iodine chloride, arsenic pentafluoride, ferric chloride, molybdenum pentachloride, stannic chloride, sulphuric acid, or perchloric acid.

3. Lignin polymer as claimed in claim 2 wherein the compound that activates the conductivity is iodine.

4. Lignin polymer as claimed in claim 2 wherein the compound that activates the conductivity is ferric chloride.

5. Lignin polymer as claimed in claim 2 wherein the agent that activates the conductivity is arsenic pentafluoride.

6. Lignin polymer as claimed in claim 1 wherein the agent that activates the conductivity is lithium, sodium, or potassium.

7. Process for the preparation of a lignin polymer as claimed in claim 1 comprising adding the compound activating the conductivity of said undoped polymer by means of vaporization.

8. Process for the preparation of a lignin polymer as claimed in claim 1 comprising adding the compound activating the conductivity of said undoped polymer by means of a solution of the compound in an organic solvent.

9. Process as claimed in claim 7 wherein the activating agent is added in an inert atmosphere.

10. Process for the preparation of a lignin polymer as claimed in claim 2 comprising adding the compound activating the conductivity of said undoped polymer by means of vaporization.

11. Process for the preparation of a lignin polymer as claimed in claim 3 comprising adding the compound activating the conductivity of said undoped polymer by means of vaporization.

12. Process for the preparation of a lignin polymer as claimed in claim 4 comprising adding the compound activating the conductivity of said undoped polymer by means of vaporization.

13. Process for the preparation of a lignin polymer as claimed in claim 5 comprising adding the compound activating the conductivity of said undoped polymer by means of vaporization.

14. Process for the preparation of a lignin polymer as claimed in claim 6 comprising adding the compound activating the conductivity of said undoped polymer by means of vaporization.

15. Process for the preparation of a lignin polymer as claimed in claim 2 comprising adding the compound activating the conductivity of said undoped polymer by means of a solution of the compound in an organic solvent.

16. Process for the preparation of a lignin polymer as claimed in claim 3 comprising adding the compound activating the conductivity of said undoped polymer by means of a solution of a compound in an organic solvent.

17. Process as claimed in claim 8 wherein the activating agent is added in an inert atmosphere.

18. Doped lignin polymer comprising an undoped polymer containing a maximum of 55% by weight of sulfur and a p-type or n-type compound activating the conductivity of said polymer in a quantity of 0.1 to 60% of the weight of the undoped polymer.

* * * * *